US012613771B2

(12) United States Patent
Parry et al.

(10) Patent No.: US 12,613,771 B2
(45) Date of Patent: **\*Apr. 28, 2026**

(54) METHODS AND SYSTEM WITH DYNAMIC ECC VOLTAGE AND FREQUENCY

(71) Applicant: Lodestar Licensing Group, LLC, Evanston, IL (US)

(72) Inventors: Jonathan Scott Parry, Boise, ID (US); Nadav Grosz, Broomfield, CO (US); David Aaron Palmer, Boise, ID (US); Christian M. Gyllenskog, Meridian, ID (US)

( \* ) Notice: Subject to any disclaimer, the term of this patent is extended or adjusted under 35 U.S.C. 154(b) by 2 days.

This patent is subject to a terminal disclaimer.

(21) Appl. No.: 18/790,407

(22) Filed: Jul. 31, 2024

(65) Prior Publication Data

US 2024/0394143 A1 Nov. 28, 2024

Related U.S. Application Data

(63) Continuation of application No. 18/221,176, filed on Jul. 12, 2023, now Pat. No. 12,086,027, which is a
(Continued)

(51) Int. Cl.
*G06F 11/10* (2006.01)
*G06F 3/06* (2006.01)
(Continued)

(52) U.S. Cl.
CPC ........ *G06F 11/1044* (2013.01); *G06F 3/0619* (2013.01); *G06F 3/0625* (2013.01); *G06F 3/0653* (2013.01); *G06F 3/0655* (2013.01); *G06F 3/0659* (2013.01); *G06F 3/0688*

(2013.01); *G06F 11/1048* (2013.01); *G06F 11/1068* (2013.01); *G06F 11/1072* (2013.01); *G06F 11/3024* (2013.01);
(Continued)

(58) Field of Classification Search
CPC .. G06F 11/1044; G06F 3/0619; G06F 3/0625; G06F 3/0653; G06F 3/0655; G06F 3/0659; G06F 3/0688; G06F 11/1048; G06F 11/1068; G06F 11/1072; G06F 11/3024; G06F 11/3034; G06F 11/3058; G06F 11/3409; G06F 12/0246; G06F 2212/1028; G06F 2212/1032; G06F 2212/7206; G11C 29/42
USPC .... 714/763, 768, 773, 774; 365/185.09, 201
See application file for complete search history.

(56) References Cited

U.S. PATENT DOCUMENTS 8,225,036 B2 \* 7/2012 Koga .................... G06F 3/0688
711/E12.016
10,838,807 B2 11/2020 Parry et al.
(Continued)

FOREIGN PATENT DOCUMENTS

| CN | 107423160 A | 12/2017 |
| CN | 108133730 A | 6/2018 |
| CN | 111382002 A | 7/2020 |

*Primary Examiner* — John J Tabone, Jr.
(74) *Attorney, Agent, or Firm* — Fletcher Yoder, P.C.

(57) ABSTRACT
Apparatus and methods are disclosed, including using a memory controller to monitor at least one parameter related to power level of a host processor of a host device, and dynamically adjusting at least one of a clock frequency and a voltage level of an error-correcting code (ECC) subsystem
(Continued)

```
                                        ┌─200

┌─────────────────────────────────────────┐ ┌─202
│ MONITORING, BY A MEMORY CONTROLLER, AT LEAST
│ ONE PARAMETER RELATED TO POWER LEVEL OF A HOST
│   PROCESSOR OF A HOST DEVICE CONFIGURED TO
│   COMMUNICATE WITH THE MEMORY CONTROLLER.
└─────────────────────────────────────────┘
                    │
                    ▼
┌─────────────────────────────────────────┐ ┌─204
│    DYNAMICALLY ADJUSTING, BY THE MEMORY
│ CONTROLLER, AT LEAST ONE OF A CLOCK FREQUENCY
│   AND A VOLTAGE LEVEL OF AN ERROR-CORRECTING
│ CODE (ECC) SUBSYSTEM OF THE MEMORY CONTROLLER
│ BASED ON THE AT LEAST ONE PARAMETER TO CONTROL
│      POWER USAGE OF THE HOST DEVICE.
└─────────────────────────────────────────┘
``` of the memory controller based on the at least one parameter to control power usage of the host device.

19 Claims, 5 Drawing Sheets

Related U.S. Application Data continuation of application No. 17/851,782, filed on Jun. 28, 2022, now Pat. No. 11,740,963, which is a continuation of application No. 17/099,389, filed on Nov. 16, 2020, now Pat. No. 11,392,451, which is a continuation of application No. 16/237,263, filed on Dec. 31, 2018, now Pat. No. 10,838,807.

(51) Int. Cl.
| | | |
|---|---|---|
| *G06F 11/30* | (2006.01) | |
| *G06F 11/34* | (2006.01) | |
| *G06F 12/02* | (2006.01) | |
| *G11C 29/42* | (2006.01) | |

(52) U.S. Cl.
CPC ...... *G06F 11/3034* (2013.01); *G06F 11/3058* (2013.01); *G06F 11/3409* (2013.01); *G06F 12/0246* (2013.01); *G11C 29/42* (2013.01); *G06F 2212/1028* (2013.01); *G06F 2212/1032* (2013.01); *G06F 2212/7206* (2013.01); *Y02D 10/00* (2018.01)

(56) References Cited

U.S. PATENT DOCUMENTS

| | | | | |
|---|---|---|---|---|
| 11,392,451 | B2 | 7/2022 | Parry et al. | |
| 2008/0082873 | A1 | 4/2008 | Russell et al. | |
| 2009/0070651 | A1 | 3/2009 | Diggs et al. | |
| 2009/0161428 | A1* | 6/2009 | Unger | G06F 1/3203 |
| | | | | 365/185.09 |
| 2010/0199114 | A1 | 8/2010 | Jorgenson et al. | |
| 2011/0252289 | A1 | 10/2011 | Patapoutian et al. | |
| 2011/0307758 | A1 | 12/2011 | Fillingim | |
| 2014/0185388 | A1* | 7/2014 | Vaysman | G11C 16/30 |
| | | | | 365/185.23 |
| 2015/0363262 | A1 | 12/2015 | Hu et al. | |
| 2017/0017587 | A1 | 1/2017 | West et al. | |
| 2018/0191381 | A1 | 7/2018 | Achtenberg et al. | |
| 2018/0287628 | A1* | 10/2018 | Nam | H03M 7/30 |
| 2020/0210279 | A1 | 7/2020 | Parry et al. | |
| 2020/0371817 | A1* | 11/2020 | Hsu | G06F 9/44505 |
| 2020/0374310 | A1 | 11/2020 | Misra et al. | |
| 2021/0073070 | A1 | 3/2021 | Parry et al. | |
| 2022/0327019 | A1 | 10/2022 | Parry et al. | |
| 2022/0328101 | A1* | 10/2022 | Hwang | G11C 16/10 |
| 2023/0401004 | A1 | 12/2023 | Muthiah et al. | |
| 2024/0112706 | A1* | 4/2024 | Ben-Rubi | G11C 7/22 |
| 2024/0394143 | A1* | 11/2024 | Parry | G06F 3/0655 |

* cited by examiner

FIG. 3A

| HOST LANES | HOST SERDES SPEED | HOST THROUGHPUT CONSUMED | CPU1 CLOCK RATE (MHZ) | CPU1 VOLTAGE (V) | CPU1 CLOCK RATE (MHZ) | CPU1 VOLTAGE (V) | LDPC CLOCK RATE (MHZ) | LDPC VOLTAGE (V) | NAND I/O CLOCK RATE (MHZ) | NAND I/O VOLTAGE (V) | INTERNAL BUS RATE (MHZ) | CORE LOGIC VOLTAGE (V) |
|---|---|---|---|---|---|---|---|---|---|---|---|---|
| 2 | 16GBIT | 2GB/S | 550 | 0.85 | 450 | 0.82 | 625 | 0.85 | 800MT | 1.2 | 500 | 0.85 |
| 2 | 16GBIT | 1GB/S | 550 | 0.85 | 450 | 0.82 | 325 | 0.85 | 400MT | 1.2 | 500 | 0.85 |
| 1 | 16GBIT | 1GB/S | 550 | 0.85 | 450 | 0.82 | 325 | 0.85 | 400MT | 1.2 | 500 | 0.85 |
| 2 | 8GBIT | 0.9GB/S | 450 | 0.82 | 350 | 0.8 | 325 | 0.85 | 400MT | 1.2 | 500 | 0.85 |
| 1 | 8GBIT | 0.45GB/S | 350 | 0.8 | 350 | 0.8 | 120 | 0.82 | 200MT | 1.15 | 250 | 0.82 |
| 1 | 1GBIT | 0.06GB/S | 250 | 0.8 | 250 | 0.8 | 120 | 0.82 | 200MT | 1.15 | 250 | 0.82 |

FIG. 3B

| CASE | UFS GIB/S | UFS MIB | UFS BYTES OUT | LDPC OUT GIB/S | LDPC OUT MIB | BYTES OUT OF LDPC | LPDC INPUT GIB/S | LDPC IN MIB | BYTES INTO LDPC | EFFECTIVE ONFI RATE TO SATURATE MT |
|---|---|---|---|---|---|---|---|---|---|---|
| MAX THEORETICAL | 2,100 | 2100 | 2,200,000,000 | 2,300 | 2400 | 2,500,000,000 | 2,600 | 2600 | 2,800,000,000 | 2800 |
| 2G | 2,000 | 2000 | 2,100,000,000 | 2,200 | 2200 | 2,300,000,000 | 2,400 | 2500 | 2,600,000,000 | 2600 |
| 2G-10% | 1,700 | 1800 | 1,800,000,000 | 1,900 | 2000 | 2,000,000,000 | 2,100 | 2200 | 2,300,000,000 | 2300 |
| 2G-20% | 1,600 | 1600 | 1,700,000,000 | 1,700 | 1800 | 1,900,000,000 | 1,900 | 2000 | 2,100,000,000 | 2100 |

METHODS AND SYSTEM WITH DYNAMIC ECC VOLTAGE AND FREQUENCY

CROSS-REFERENCE TO RELATED APPLICATIONS

This application is a continuation of U.S. application Ser. No. 18/221,176, filed Jul. 12, 2023, which is a continuation of U.S. application Ser. No. 17/851,782, filed Jun. 28, 2022, now issued as U.S. Pat. No. 11,740,963, which is a continuation of U.S. application Ser. No. 17/099,389, filed Nov. 16, 2020, now issued as U.S. Pat. No. 11,392,451, which is a continuation of U.S. application Ser. No. 16/237,263, filed Dec. 31, 2018, now issued as U.S. Pat. No. 10,838,807, each of which is incorporated herein by reference in its entirety.

BACKGROUND

Memory devices are semiconductor circuits that provide electronic storage of data for a host system (e.g., a computer or other electronic device). Memory devices may be volatile or non-volatile. Volatile memory requires power to maintain data, and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically erasable programmable ROM (EEPROM), erasable programmable ROM (EPROM), resistance variable memory, such as phase change random access memory (PCRAM), resistive random-access memory (RRAM), or magnetoresistive random access memory (MRAM), among others.

Host systems typically include a host processor, a first amount of main memory (e.g., often volatile memory, such as DRAM) to support the host processor, and one or more storage systems (e.g., often non-volatile memory, such as flash memory) that provide additional storage to retain data in addition to or separate from the main memory.

A storage system, such as a solid-state drive (SSD), can include a memory controller and one or more memory devices, including a number of dies or logical units (LUNs). In certain examples, each die can include a number of memory arrays and peripheral circuitry thereon, such as die logic or a die processor. The memory controller can include interface circuitry configured to communicate with a host device (e.g., the host processor or interface circuitry) through a communication interface (e.g., a bidirectional parallel or serial communication interface). The memory controller can receive commands or operations from the host system in association with memory operations or instructions, such as read or write operations to transfer data (e.g., user data and associated integrity data, such as error data or address data, etc.) between the memory devices and the host device, erase operations to erase data from the memory devices, perform drive management operations (e.g., data migration, garbage collection, block retirement), etc.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 3A illustrates an example of power usage by a host device based on bandwidth used for processing.

FIG. 3B illustrates an example of ECC usage by a host device based on bandwidth used for processing.

DETAILED DESCRIPTION

Figure 1:
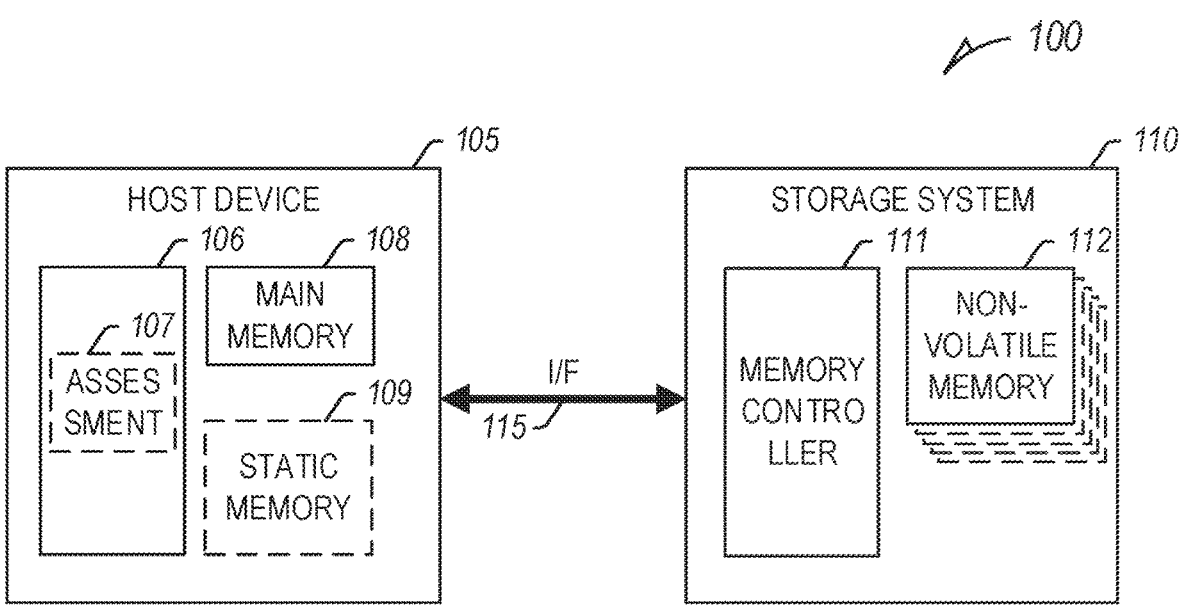
FIG. 1 illustrates an example host system including a host device and a storage system.

Software (e.g., programs), instructions, operating systems (OS), and other data are typically stored on storage systems and accessed by main memory for use by a host processor. Main memory (e.g., RAM) is typically faster, more expensive, and a different type of memory device (e.g., volatile) than a majority of the memory devices of the storage system (e.g., non-volatile, such as an SSD, etc.). In addition to the main memory, host systems can include different levels of volatile memory, such as a group of static memory (e.g., a cache, often SRAM), often faster than the main memory, in certain examples, configured to operate at speeds close to or exceeding the speed of the host processor, but with lower density and higher cost. In other examples, more or less levels or quantities of main memory or static memory can be used, depending on desired host system performance and cost.

Flash memory devices, such as SSD, typically include one or more groups of one-transistor, floating gate memory cells. Two common types of flash memory array architectures include NAND and NOR architectures. The floating gate memory cells of the memory array are typically arranged in a matrix.

Mobile host device systems have limited power resources based on current battery sizes and available materials. These mobile systems use less bandwidth during certain operations but must support burst performance when needed. To prevent excessive power loss, certain systems can be adjusted to account for performance demands. The present subject matter provides for dynamically adjusting error correcting code (ECC) voltages and frequencies based on host system power level, power demands, error rates, media wear and environmental conditions, to regulate power loss. Advantages include avoiding excessive power loss and providing sufficient peak power on demand, especially for mobile and internet of things (IOT) applications.

ECC logic has evolved with increasing error correction strength, gate count and power demands to match increasing burst bandwidth needs, and thus has experienced an increased power usage. ECC subsystems, such as low parity density check (LPDC) systems, can have variable code rates as a function of parity size. In addition, processors can use dynamic voltage and frequency scaling, but the present subject matter provides for using monitoring of a storage subsystem behavior to dynamically adjust voltage and frequency for ECC subsystems. The system or firmware in the storage subsystem monitors the host system's bandwidth or demand to determine ECC throughput in addition to throughput needed from other subsystems such as: central processing unit (CPU); internal bus; or MRAM, in various embodiments. The system also monitors the bit error rate and health, amount of wear of the media (NAND, for example), and/or temperature or other environmental conditions. Based on the monitored metrics (and other scaling factors), the present subject matter dynamically adjusts the clock frequency and voltage levels of the ECC logic and associated subsystems.

In various embodiments, the present subject matter determines host system power and bandwidth needs and uses various monitored metrics as inputs to determine at what level ECC voltages and frequencies should be adjusted to regulate power loss. The monitored metrics can include a number of lanes uses, host serializer/deserializer (serdes) speed, measured queue depth, total data in flight, a running estimate of data use over time, a counter of bytes used over time, an estimate of bytes used over time, a host bandwidth monitor, a host traffic monitor that collects statistics on writes vs. reads, a bit error rate monitor, a health and wear monitor, a temperature sensor, and/or a voltage monitor. In some embodiments, the present subject matter uses scaling factors, thresholds, hysteresis and/or a performance mode setting. Various embodiments maintain performance of the host device and memory subsystem while using low power states when applicable. The present system includes a save/restore mechanism to save a last setting of the ECC voltages and frequencies when going to sleep mode, to anticipate lower bandwidth needs using sleep mode.

The present subject matter lowers ECC power and frequency using a variety of methods, including: using a clock frequency control; using a voltage level control; using an ECC engine with ring buffers to handle clock domain frequencies; using ECC with glitch-less clocking that can support on-the-fly frequency and voltage changes; using ECC that can operate with variable voltages and clock frequencies; using a per channels ECC engine that runs at different voltages and frequencies for different channels; and using ECC generation logic (for encoding) that runs at a different voltage than ECC checking logic (for decoding).

Aspects of the present disclosure are directed to a storage system including a memory array and a memory controller configured to communicate with a host processor of a host device. The memory controller is programmed to perform operations including monitoring at least one parameter related to power level of the host processor, and dynamically adjusting at least one of a clock frequency and a voltage level of an error-correcting code (ECC) subsystem of the memory controller based on the at least one parameter to control power usage of the host device.

FIG. 1 illustrates an example system (e.g., a host system) 100 including a host device 105 and a storage system 110 configured to communicate over a communication interface (I/F) 115 (e.g., a bidirectional parallel or serial communication interface). The host device 105 can include a host processor 106 (e.g., a host central processing unit (CPU) or other processor or processing device) or other host circuitry (e.g., a memory management unit (MMU), interface circuitry, assessment circuitry 107, etc.). In certain examples, the host device 105 can include a main memory 108 (e.g., DRAM, etc.) and optionally, a static memory 109, to support operation of the host processor 106.

The storage system 110 can include a universal flash storage (UFS) device, an embedded MMC (eMMC™) device, or one or more other memory devices. For example, if the storage system 110 includes a UFS device, the communication interface 115 can include a serial bidirectional interface, such as defined in one or more Joint Electron Device Engineering Council (JEDEC) standards (e.g., JEDEC standard D223D (JESD223D), commonly referred to as JEDEC UFS Host Controller Interface (UFSHCI) 3.0, etc.). In another example, if the storage system 110 includes an eMMC device, the communication interface 115 can include a number of parallel bidirectional data lines (e.g., DAT [7:0]) and one or more command lines, such as defined in one or more JEDEC standards (e.g., JEDEC standard D84-B51 (JESD84-A51), commonly referred to as JEDEC eMMC standard 5.1, etc.). In other examples, the storage system 110 can include one or more other memory devices, or the communication interface 115 can include one or more other interfaces, depending on the host device 105 and the storage system 110.

The storage system 110 can include a memory controller 111 and a non-volatile memory 112. In an example, the non-volatile memory can include a number of memory devices (e.g., dies or LUNs), such as one or more flash memory devices, etc., each including periphery circuitry thereon, and controlled by the memory controller 111.

Flash memory devices typically include one or more groups of one-transistor, floating gate memory cells. Two common types of flash memory array architectures include NAND and NOR architectures. The floating gate memory cells of the memory array are typically arranged in a matrix. The gates of each memory cell in a row of the array are coupled to an access line (e.g., a word line). In NOR architecture, the drains of each memory cell in a column of the array are coupled to a data line (e.g., a bit line). In NAND architecture, the drains of each memory cell in a column of the array are coupled together in series, source to drain, between a source line and a bit line.

Each memory cell in a NOR, NAND, 3D Cross Point (Xpoint), Holographic RAM (HRAM), MRAM, or one or more other architecture semiconductor memory array can be programmed individually or collectively to one or a number of programmed states. A single-level cell (SLC) can represent one bit of data per cell in one of two programmed states (e.g., 1 or 0). A multi-level cell (MLC) can represent two or more bits of data per cell in a number of programmed states (e.g., $2^n$, where n is the number of bits of data). In certain examples, MLC can refer to a memory cell that can store two bits of data in one of 4 programmed states. A triple-level cell (TLC) can represent three bits of data per cell in one of 8 programmed states. A quad-level cell (QLC) can represent four bits of data per cell in one of 16 programmed states. MLC is used herein in its broader context, to refer to any memory cell that can store more than one bit of data per cell (i.e., that can represent more than two programmed states), including TLC and QLC, etc.

The storage system 110 can include a multimedia card (MMC) solid-state storage device (e.g., micro secure digital (SD) cards, etc.). MMC devices include a number of parallel interfaces (e.g., an 8-bit parallel interface) with a host device 105, and are often removable and separate components from the host device. In contrast, embedded MMC (eMMC) devices are attached to a circuit board and considered a component of the host device, with read speeds that rival serial ATA (SATA) based SSD devices. As demand for mobile device performance continues to increase, such as to fully enable virtual or augmented-reality devices, utilize increasing networks speeds, etc., storage systems have shifted from parallel to serial communication interfaces. UFS devices, including controllers and firmware, communicate with a host device using a low-voltage differential signaling (LVDS) serial interface with dedicated read/write paths, further advancing read/write speeds between a host device and a storage system.

In three-dimensional (3D) architecture semiconductor memory device technology, vertical floating gate or charge trapping storage structures can be stacked, increasing the number of tiers, physical pages, and accordingly, the density of memory cells in a memory device.

Data is often stored arbitrarily on the storage system as small units. Even if accessed as a single unit, data can be received in small, random 4-16k single file reads (e.g., 60%-80% of operations are smaller than 16k). It is difficult for a user and even kernel applications to indicate that data should be stored as one sequential cohesive unit. File systems are typically designed to optimize space usage, and not sequential retrieval space.

The memory controller 111 can receive instructions from the host device 105, and can communicate with the non-volatile memory 112, such as to transfer data to (e.g., write or erase) or from (e.g., read) one or more of the memory cells of the non-volatile memory array 112. The memory controller 111 can include, among other things, circuitry or firmware, such as a number of components or integrated circuits. For example, the memory controller 111 can include one or more memory control units, circuits, or components configured to control access across the memory array and to provide a translation layer between the host device 105 and the storage system 100.

The non-volatile memory array 112 (e.g., a 3D NAND architecture semiconductor memory array) can include a number of memory cells arranged in, for example, a number of devices, planes, blocks, or physical pages. As one example, a TLC memory device can include 18,592 bytes (B) of data per page, 1536 pages per block, 548 blocks per plane, and 4 planes per device. As another example, an MLC memory device can include 18,592 bytes (B) of data per page, 1024 pages per block, 548 blocks per plane, and 4 planes per device, but with half the required write time and twice the program/erase (P/E) cycles as a corresponding TLC memory device. Other examples can include other numbers or arrangements.

Figure 2:
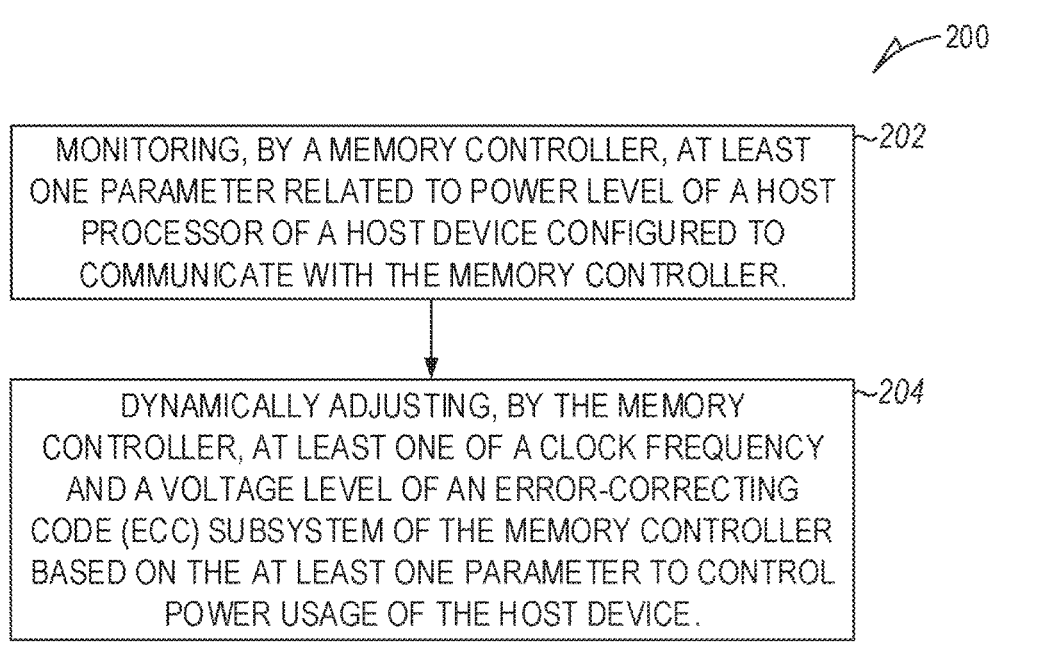
FIG. 2 illustrates an example method for dynamically adjusting error correcting code (ECC) voltages and frequencies.

FIG. 2 illustrates an example method 200 for dynamically adjusting error correcting code (ECC) voltages and frequencies. The method 200 includes using a memory controller to monitor at least one parameter related to power level of a host processor of a host device, at step 202. At step 204, the memory controller dynamically adjusts at least one of a clock frequency and a voltage level of an error-correcting code (ECC) subsystem of the memory controller based on the at least one parameter to control power usage of the host device. FIG. 3A illustrates an example of power usage by a host device based on bandwidth used for processing. In various embodiments, host throughput can be measured as activity or work pending in a queue. As memory ages, error frequency increases, requiring ECC logic to work harder over time. The present subject matter can be used to scale ECC strength to reflect this increased demand. Thus, parameters or metrics such as memory health, life time, bandwidth usage, and wear can be monitored and used for dynamically adjusting ECC power usage, in various embodiments. FIG. 3B illustrates an example of ECC usage by a host device based on bandwidth used for processing.

In various embodiments, the present system dynamically adjusts voltage for ECC logic in the memory controller between 0.7 and 1.0 Volts. Other voltages can be used without departing from the scope of the present subject matter. The present system adjusts frequency for ECC logic in the memory controller between 100 MHz and 1000 MHz, in various embodiments. Other frequencies can be used without departing from the scope of the present subject matter. By dynamically adjusting these parameters, less power is used by using lower voltages and frequencies based on feedback from monitored metrics, such as host power level and demand.

The present system can set and change monitored thresholds, voltages and frequencies using hardware or software. For example, hardware blocks can set thresholds and/or directly regulate voltage and frequency, such as by providing separate clocks in various embodiments. In some embodiments, thresholds or code to perform any of the included examples can be stored in a fuse, a metal mask, a bonding option, a substrate wiring option, a bootstrap hardware (HW) select pin, or a ROM setting. The present subject matter refers to programmable operations and programmable thresholds, which can include hardware selected or configured operations and thresholds in various examples. In some examples, programmable code, settings or thresholds refer to settings that are configured through blown fuses, ROM mask changes, wire bonds, substrate connections, configurations pins, or configuration signals. Additional program storage methods can be used without departing from the scope of the present subject matter.

Figure 4:
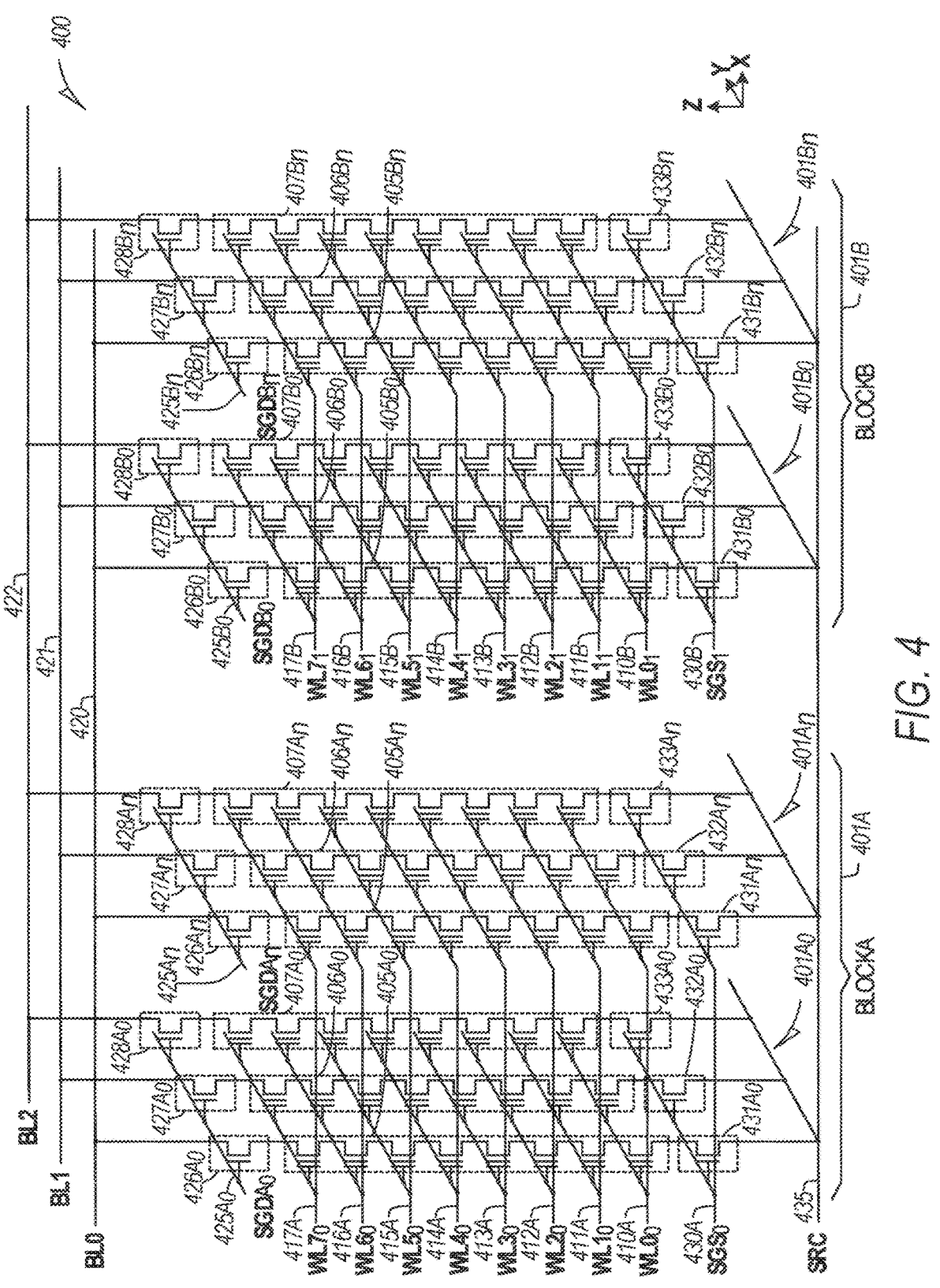
FIG. 4 illustrates an example schematic diagram of a 3D NAND architecture semiconductor memory array.

FIG. 4 illustrates an example schematic diagram of a 3D NAND architecture semiconductor memory array 400 including a number of strings of memory cells (e.g., first-third $A_0$ memory strings $405A_0$-$407A_0$, first-third $A_n$ memory strings $405A_n$-$407A_n$, first-third $B_0$ memory strings $405B_0$-$407B_0$, first-third $B_n$ memory strings $405B_n$-$407B_n$, etc.), organized in blocks (e.g., block A 401A, block B 401B, etc.) and sub-blocks (e.g., sub-block $A_0$ $401A_0$, sub-block $A_n$ $401A_n$, sub-block $B_0$ $401B_0$, sub-block $B_n$ $401B_n$, etc.). The memory array 400 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 435 or a source-side select gate (SGS) (e.g., first-third $A_0$ SGS $431A_0$-$433A_0$, first-third $A_n$ SGS $431A_n$-$433A_n$, first-third $B_0$ SGS $431B_0$-$433B_0$, first-third $B_n$ SGS $431B_n$-$433B_n$, etc.) and a drain-side select gate (SGD) (e.g., first-third $A_0$ SGD $426A_0$-$428A_0$, first-third $A_n$ SGD $426A_n$-$428A_n$, first-third $B_0$SGD $426B_0$-$428B_0$, first-third $B_n$ SGD $426B_n$-$428B_n$, etc.). Each string of memory cells in the 3D memory array can be arranged along the X direction as data lines (e.g., bit lines (BL) BL0-BL6 420-422), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 400 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 400 includes a control gate (CG) coupled to (e.g., electrically or otherwise operatively connected to) an access line (e.g., word lines (WL) $WL0_0$-$WL7_0$, 410A-417A, $WL0_1$-$WL7_1$ 410B-417B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD 426A_0-428A_0 can be accessed using an $A_0$ SGD line $SGDA_0$425A_0, first-third $A_n$ SGD 426A_n-428A_n can be accessed using an SGD line $SGDA_n$ 425A_n, first-third $B_0$ SGD 426B_0-428B_0 can be accessed using an $B_0$ SGD line $SGDB_0$ 425B_0, and first-third $B_n$ SGD 426B_n-428B_n can be accessed using an $B_n$ SGD line $SGDB_n$ 425B_n. First-third $A_0$ SGS 431A_0-433A_0 and first-third $A_n$ SGS 431A_n-433A_n can be accessed using a gate select line $SGS_0$ 430A, and first-third $B_0$ SGS 431B_0-433B_0 and first-third $B_n$ SGS 431B_n-433B_n can be accessed using a gate select line $SGS_1$ 430B.

In an example, the memory array 400 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

In a NAND architecture semiconductor memory array, the state of a selected memory cell can be accessed by sensing a current or voltage variation associated with a particular data line containing the selected memory cell. The memory array 400 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., $WL4_0$), and thus, to a control gate of each memory cell coupled to the selected word lines. Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as $WL4_0$, a pass voltage of 10V can be applied to one or more other word lines, such as $WL3_0$, $WL5_0$, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to $WL4_0$, a pass voltage of 10V can be applied to $WL3_0$ and $WL5_0$, a pass voltage of 8V can be applied to $WL2_0$ and $WL6_0$, a pass voltage of 7V can be applied to $WL1_0$ and $WL7_0$, etc. In other examples, the pass voltages, or number of word lines, etc., can be higher or lower, or more or less.

Sense amplifiers can be coupled to one or more of the data lines (e.g., first, second, or third bit lines (BL0-BL2) 420-422), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 5:
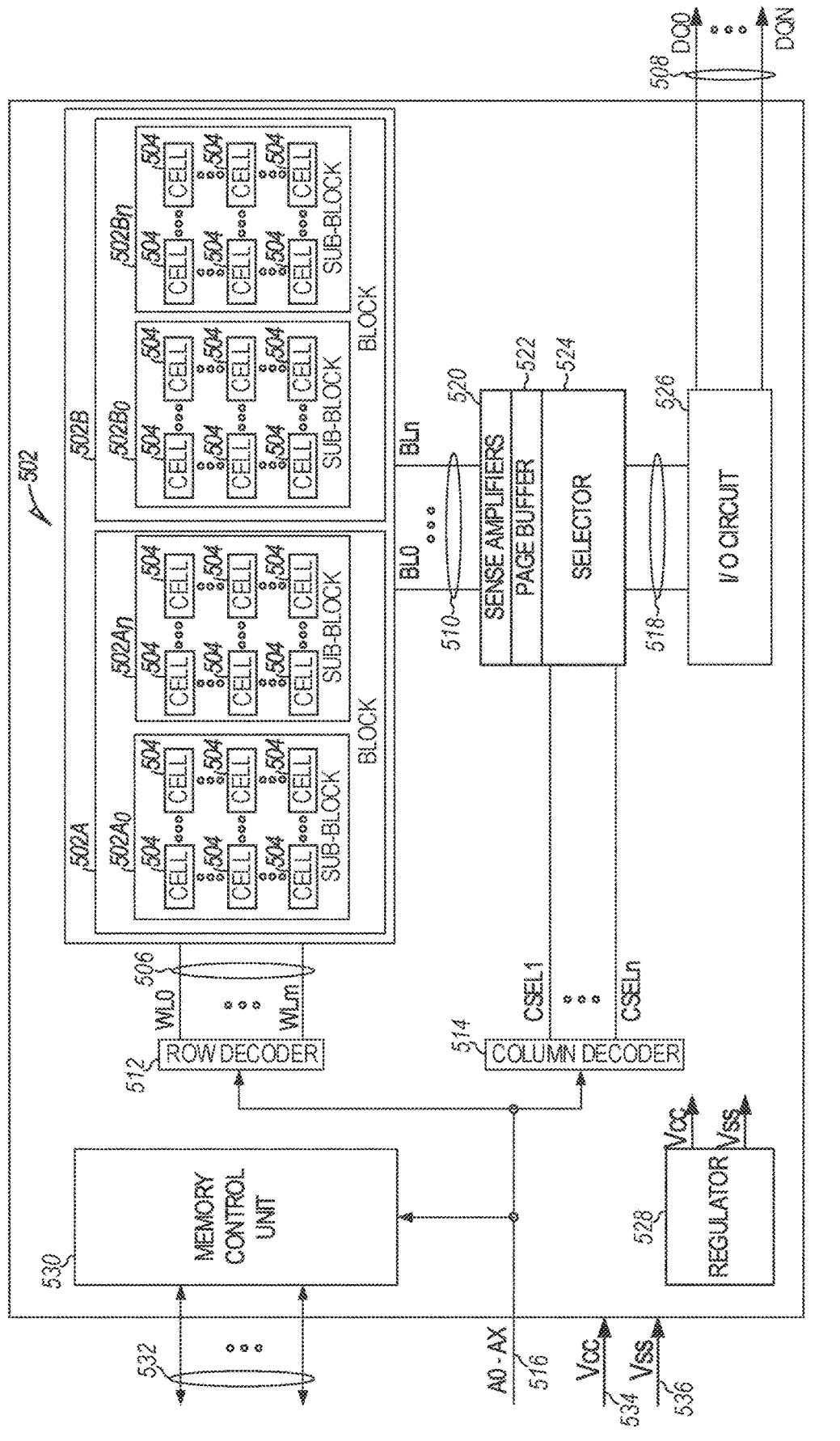
FIG. 5 illustrates an example block diagram of a memory module.

FIG. 5 illustrates an example block diagram of a memory device 500 including a memory array 502 having a plurality of memory cells 504, and one or more circuits or components to provide communication with, or perform one or more memory operations on, the memory array 502. Although shown with a single memory array 502, in other examples, one or more additional memory arrays, dies, or LUNs can be included herein. In certain examples, in a storage system having a number of dies or LUNs, the memory device 500 can represent a block diagram of circuits and components for each die or LUN. The memory device 500 can include a row decoder 512, a column decoder 514, sense amplifiers 520, a page buffer 522, a selector 524, an input/output (I/O) circuit 526, and a memory control unit 530.

The memory cells 504 of the memory array 502 can be arranged in blocks, such as first and second blocks 502A, 502B. Each block can include sub-blocks. For example, the first block 502A can include first and second sub-blocks $502A_0$, $502A_n$, and the second block 502B can include first and second sub-blocks $502B_0$, $502B_n$. Each sub-block can include a number of physical pages, each page including a number of memory cells 504. Although illustrated herein as having two blocks, each block having two sub-blocks, and each sub-block having a number of memory cells 504, in other examples, the memory array 502 can include more or fewer blocks, sub-blocks, memory cells, etc. In other examples, the memory cells 504 can be arranged in a number of rows, columns, pages, sub-blocks, blocks, etc., and accessed using, for example, access lines 506, first data lines 510, or one or more select gates, source lines, etc.

The memory control unit 530 can control memory operations of the memory device 500 according to one or more signals or instructions received on control lines 532, including, for example, one or more clock signals or control signals that indicate a desired operation (e.g., write, read, erase, etc.), or address signals (A0-AX) received on one or more address lines 516. One or more devices external to the memory device 500 can control the values of the control signals on the control lines 532, or the address signals on the address line 516. Examples of devices external to the memory device 500 can include, but are not limited to, a host, a memory controller, a processor, or one or more circuits or components not illustrated in FIG. 5.

The memory device 500 can use access lines 506 and first data lines 510 to transfer data to (e.g., write or erase) or from (e.g., read) one or more of the memory cells 504. The row decoder 512 and the column decoder 514 can receive and decode the address signals (A0-AX) from the address line 516, can determine which of the memory cells 504 are to be accessed, and can provide signals to one or more of the access lines 506 (e.g., one or more of a plurality of word lines (WL0-WLm)) or the first data lines 510 (e.g., one or more of a plurality of bit lines (BL0-BLn)), such as described above.

The memory device 500 can include sense circuitry, such as the sense amplifiers 520, configured to determine the values of data on (e.g., read), or to determine the values of data to be written to, the memory cells 504 using the first data lines 510. For example, in a selected string of memory cells 504, one or more of the sense amplifiers 520 can read a logic level in the selected memory cell 504 in response to a read current flowing in the memory array 502 through the selected string to the data lines 510.

One or more devices external to the memory device 500 can communicate with the memory device 500 using the I/O lines (DQ0-DQN) 508, address lines 516 (A0-AX), or control lines 532. The input/output (I/O) circuit 526 can transfer values of data in or out of the memory device 500, such as in or out of the page buffer 522 or the memory array 502, using the I/O lines 508, according to, for example, the control lines 532 and address lines 516. The page buffer 522 can store data received from the one or more devices external to the memory device 500 before the data is programmed into relevant portions of the memory array 502, or can store data read from the memory array 502 before the data is transmitted to the one or more devices external to the memory device 500.

The column decoder 514 can receive and decode address signals (A0-AX) into one or more column select signals (CSEL1-CSELn). The selector 524 (e.g., a select circuit) can receive the column select signals (CSEL1-CSELn) and select data in the page buffer 522 representing values of data to be read from or to be programmed into memory cells 504. Selected data can be transferred between the page buffer 522 and the I/O circuit 526 using second data lines 518.

The memory control unit 530 can receive positive and negative supply signals, such as a supply voltage (Vcc) 534 and a negative supply (Vss) 536 (e.g., a ground potential), from an external source or supply (e.g., an internal or external battery, an AC-to-DC converter, etc.). In certain examples, the memory control unit 530 can include a regulator 528 to internally provide positive or negative supply signals.

Figure 6:
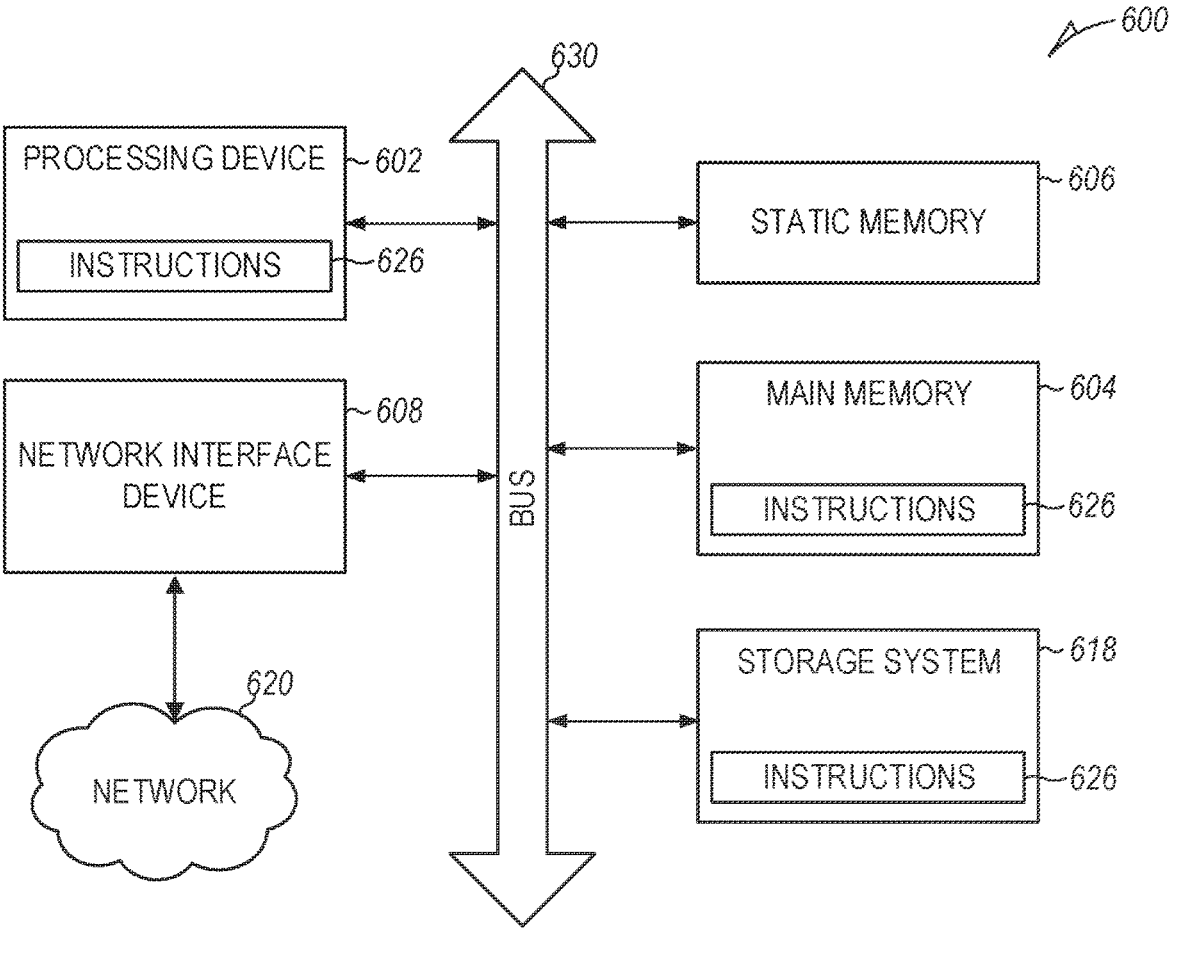
FIG. 6 illustrates an example block diagram of an information handling system.

FIG. 6 illustrates a block diagram of an example machine (e.g., a host system) 600 upon which any one or more of the techniques (e.g., methodologies) discussed herein may perform. In alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (P2P) (or other distributed) network environment. The machine 600 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 600 may include a processing device 602 (e.g., a hardware processor, a central processing unit (CPU), a graphics processing unit (GPU), a hardware processor core, or any combination thereof, etc.), a main memory 604 (e.g., read-only memory (ROM), dynamic random-access memory (DRAM) such as synchronous DRAM (SDRAM) or Rambus DRAM (RDRAM), etc.), a static memory 606 (e.g., static random-access memory (SRAM), etc.), and a storage system 618, some or all of which may communicate with each other via a communication interface (e.g., a bus) 630.

The processing device 602 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 can be configured to execute instructions 626 for performing the operations and steps discussed herein. The computer system 600 can further include a network interface device 608 to communicate over a network 620.

The storage system 618 can include a machine-readable storage medium (also known as a computer-readable medium) on which is stored one or more sets of instructions 626 or software embodying any one or more of the methodologies or functions described herein. The instructions 626 can also reside, completely or at least partially, within the main memory 604 or within the processing device 602 during execution thereof by the computer system 600, the main memory 604 and the processing device 602 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 600 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 600 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 626 (e.g., software, programs, an operating system (OS), etc.) or other data are stored on the storage system 618 can be accessed by the main memory 604 for use by the processing device 602. The main memory 604 (e.g., DRAM) is typically fast, but volatile, and thus a different type of storage than the storage system 618 (e.g., an SSD), which is suitable for long-term storage, including while in an "off" condition. The instructions 626 or data in use by a user or the machine 600 are typically loaded in the main memory 604 for use by the processing device 602. When the main memory 604 is full, virtual space from the storage system 618 can be allocated to supplement the main memory 604; however, because the storage system 618 device is typically slower than the main memory 604, and write speeds are typically at least twice as slow as read speeds, use of virtual memory can greatly reduce user experience due to storage system latency (in contrast to the main memory 604, e.g., DRAM). Further, use of the storage system 618 for virtual memory can greatly reduce the usable lifespan of the storage system 618.

The instructions 624 may further be transmitted or received over a network 620 using a transmission medium via the network interface device 608 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 608 may include one or more physical jacks (e.g., Ethernet, coaxial, or phone jacks) or one or more antennas to connect to the network 620. In an example, the network interface device 608 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 600, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a select gate source (SGS), a control gate (CG), and a select gate drain (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (i.e., the memory cell may be programmed to an erased state).

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times.

Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

Example 1 is a storage system comprising: a memory array; and a memory controller configured to communicate with a host processor of a host device, wherein the memory controller is programmed to perform operations including: monitoring at least one parameter related to power level of the host processor; and dynamically adjusting at least one of a clock frequency and a voltage level of an error-correcting code (ECC) subsystem of the memory controller based on the at least one parameter to control power usage of the host device.

In Example 2, the subject matter of Example 1 is optionally configured such that the at least one parameter includes battery level of the host processor.

In Example 3, the subject matter of Example 1 is optionally configured such that the at least one parameter includes bandwidth of the host processor.

In Example 4, the subject matter of Example 1 is optionally configured such that the at least one parameter includes a processing speed demand of the host processor.

In Example 5, the subject matter of Example 1 is optionally configured such that the at least one parameter includes a bit error rate of the storage system.

In Example 6, the subject matter of Example 1 is optionally configured such that the at least one parameter includes an amount of wear of the memory array.

In Example 7, the subject matter of Example 1 is optionally configured such that the at least one parameter includes an environmental condition.

In Example 8, the subject matter of Example 7 is optionally configured such that the environmental condition includes an environmental temperature.

In Example 9, the subject matter of any of Examples 1-8 is optionally configured such that the memory controller is further programmed to perform operations comprising: saving a last setting of at least one of a clock frequency and a voltage level of an error-correcting code (ECC) subsystem of the memory controller; and restoring the last setting when entering or exiting sleep mode for the storage system.

Example 10 is a method comprising: monitoring, by a memory controller, at least one parameter related to power level of a host processor of a host device configured to communicate with the memory controller; and dynamically adjusting, by the memory controller, at least one of a clock frequency and a voltage level of an error-correcting code (ECC) subsystem of the memory controller based on the at least one parameter to control power usage of the host device.

In Example 11, the subject matter of Example 10 is optionally configured such that dynamically adjusting the clock frequency of the ECC subsystem includes using ring buffers to adjust for clock domain differences for the ECC subsystem.

In Example 12, the subject matter of Example 10 is optionally configured such that dynamically adjusting the clock frequency of the ECC subsystem includes using glitch-less clocking to support dynamic frequency changes for the ECC subsystem.

In Example 13, the subject matter of Example 10 is optionally configured such that dynamically adjusting the voltage of the ECC subsystem includes using glitch-less clocking to support dynamic voltage changes for the ECC subsystem.

In Example 14, the subject matter of Example 10 is optionally configured such that the ECC subsystem includes a per channel voltage system that supports different voltages for operation of the ECC subsystem on different channels.

In Example 15, the subject matter of Example 10 is optionally configured such that the ECC subsystem includes a per channel frequency system that supports different frequencies for operation of the ECC subsystem on different channels.

In Example 16, the subject matter of Example 10 is optionally configured such that the ECC subsystem includes a ECC generation logic and a ECC checking logic, and wherein the ECC generation logic is configured to operate at a different voltage level than the ECC checking logic.

In Example 17, the subject matter of Example 10 is optionally configured such that the ECC subsystem includes a ECC generation logic and a ECC checking logic, and wherein the ECC generation logic is configured to operate at a different frequency level than the ECC checking logic.

Example 18 is a device readable storage medium that provides instructions that, when executed by a processor, cause the processor to perform operations comprising: monitoring at least one parameter related to power level of a host processor of a host device configured to communicate with the processor; and dynamically adjusting at least one of a clock frequency and a voltage level of an error-correcting code (ECC) subsystem based on the at least one parameter to control power usage of the host device.

In Example 19, the subject matter of Example 18 is optionally configured such that the processor is further programmed to perform operations comprising: saving a last setting of at least one of a clock frequency and a voltage level of an error-correcting code (ECC) subsystem of the memory controller.

In Example 20, the subject matter of Example 19 is optionally configured such that the processor is further programmed to perform operations comprising: restoring the last setting when entering or exiting sleep mode for the storage system.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A storage system, comprising:

a memory array; and a memory controller that comprises an error-correcting code (ECC) subsystem and that is configured to:

communicate with a host processor to implement interactions between the host processor and the memory array;

monitor at least temperature of at least a portion of the storage system; and limit power consumption of the ECC subsystem of the memory controller based at least in part on the monitored temperature to control power usage of the host processor.

2. The storage system of claim 1, comprising a temperature sensor configured to monitor the temperature of the at least the portion of the storage system.

3. The storage system of claim 1, wherein the memory controller is configured to monitor a bit error rate, and the storage system comprises a bit error rate monitor configured to monitor the bit error rate for the storage system.

4. The storage system of claim 3, wherein the memory controller is configured to adjust a clock frequency or a voltage level of the ECC subsystem as a power consumption limit based at least in part on the monitored bit error rate.

5. The storage system of claim 1, wherein limiting power consumption comprises adjusting a clock frequency.

6. The storage system of claim 5, wherein adjusting the clock frequency of the ECC subsystem comprises adjusting the clock frequency between 100 MHz and 1000 MHz.

7. The storage system of claim 1, wherein limiting power consumption comprises adjusting a voltage level of the ECC subsystem.

8. The storage system of claim 7, wherein adjusting the voltage level comprises adjusting the voltage level between 0.7 V and 1.0 V.

9. The storage system of claim 1, wherein limiting the power consumption of the ECC subsystem is based at least in part on comparison of the at least one parameter to a threshold.

10. The storage system of claim 9, wherein the memory controller is configured to receive an indication of the threshold to set a temperature for the threshold.

11. The storage system of claim 1, wherein the memory controller is configured to:

save a previous setting of the ECC subsystem of the memory controller; and restore the previous setting when entering or exiting sleep mode for the storage system.

12. The storage system of claim 11, wherein the previous setting comprises a frequency or voltage level.

13. A non-transitory, computer-readable medium comprising instructions thereon that, when executed by a memory controller, cause the memory controller to perform operations comprising:

monitoring at least temperature related to processing speed of a host processor of a host device configured to communicate with the memory controller; and limiting power consumption of an error-correcting code (ECC) subsystem of the memory controller based on the monitored temperature to control power usage of the host device.

14. The non-transitory, computer-readable medium of claim 13, wherein the monitored temperature comprises an ambient temperature of the host device.

15. The non-transitory, computer-readable medium of claim 13, wherein the instructions are configured to cause the memory controller to perform operations comprising monitoring a wear of a storage medium corresponding to the memory controller, and limiting power consumption comprises adjusting, by the memory controller, a voltage level of the ECC subsystem of the memory controller based at least in part on the monitored wear of the storage medium.

16. The non-transitory, computer-readable medium of claim 15, wherein the instructions are configured to cause the memory controller to perform operations comprising comparing the monitored temperature to a programmable threshold, and limiting power consumption comprises adjusting the voltage level based at least in part on a comparison of the monitored temperature and the programmable threshold.

17. A storage system, comprising:

a memory array;

monitoring circuitry configured to monitor at least a temperature of the storage system; and a memory controller that comprises an error-correcting code (ECC) subsystem and that is configured to:

monitor the temperature of the storage system via the monitoring circuitry; and limit power consumption of the ECC subsystem of the memory controller based at least in part on the monitored temperature of the storage system.

18. The storage system of claim 17, wherein limiting power consumption comprises adjusting a clock frequency of the ECC subsystem using a ring buffer to adjust for clock domain differences within the ECC subsystem.

19. The storage system of claim 17, wherein limiting power consumption comprises adjusting a clock frequency of the ECC subsystem or adjusting a voltage level based of the at least in part on the monitored temperature or power level.

* * * * *